US009589997B2

(12) United States Patent
Imamura et al.

(10) Patent No.: US 9,589,997 B2
(45) Date of Patent: Mar. 7, 2017

(54) THIN FILM TRANSISTOR AND IMAGE DISPLAYING APPARATUS

(71) Applicant: Toppan Printing Co., Ltd., Tokyo (JP)

(72) Inventors: Chihiro Imamura, Tokyo (JP); Manabu Ito, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 14/347,251

(22) PCT Filed: Sep. 20, 2012

(86) PCT No.: PCT/JP2012/005981
§ 371 (c)(1),
(2) Date: Mar. 26, 2014

(87) PCT Pub. No.: WO2013/046606
PCT Pub. Date: Apr. 4, 2013

(65) Prior Publication Data
US 2014/0246675 A1    Sep. 4, 2014

(30) Foreign Application Priority Data

Sep. 27, 2011 (JP) ................................. 2011-211305

(51) Int. Cl.
*H01L 27/12* (2006.01)
*H01L 29/786* (2006.01)
(Continued)

(52) U.S. Cl.
CPC .......... *H01L 27/127* (2013.01); *G02F 1/1362* (2013.01); *G02F 1/136286* (2013.01);
(Continued)

(58) Field of Classification Search
CPC ............... H01L 27/1225; H01L 27/124; H01L 29/7869; H01L 27/1288; H01L 27/12;
(Continued)

(56) References Cited

U.S. PATENT DOCUMENTS

2006/0108587 A1    5/2006  Lee et al.
2007/0166894 A1    7/2007  Lim
(Continued)

FOREIGN PATENT DOCUMENTS

JP    H02-244641 A    9/1990
JP    H10-022505 A    1/1998
(Continued)

OTHER PUBLICATIONS

The Taiwan Patent Office, "Office Action," (Taiwan), (Sep. 29, 2014).
(Continued)

*Primary Examiner* — Chuong A Luu
*Assistant Examiner* — Rodolfo D Fortich
(74) *Attorney, Agent, or Firm* — Hammer & Associates, P.C.

(57) ABSTRACT

Since the gate electrode (1) and the capacitor electrode (2) are made into a double layer structure, the first layers (1a, 2a) in contact with the substrate (0) are made of ITO, and the second layers (1b, 2b) in contact with the gate insulating layer (3) are made of an metallic oxide layer, it becomes possible to form the gate electrode (1) and the capacitor electrode (2) having high optical transparency and high conductivity. Therefore, it becomes possible to improve the optical transparency of a thin film transistor and to improve the display performance of an image displaying apparatus for which the thin film transistor is used by using the above-described gate electrode (1) and the above-described capacitor electrode (2).

9 Claims, 2 Drawing Sheets

(51) Int. Cl.
*G02F 1/1362* (2006.01)
*H01L 33/42* (2010.01)

(52) U.S. Cl.
CPC ...... *H01L 27/1225* (2013.01); *H01L 27/1255* (2013.01); *H01L 29/7869* (2013.01); *H01L 33/42* (2013.01); *G02F 2001/136295* (2013.01); *G02F 2202/107* (2013.01)

(58) Field of Classification Search
CPC ................. H01L 33/42; H01L 27/7869; H01L 27/14612; H01L 27/228; H01L 27/3262; G02F 1/136213
USPC .......................................................... 257/43
See application file for complete search history.

(56) References Cited

U.S. PATENT DOCUMENTS

| | | | |
|---|---|---|---|
| 2008/0284933 A1* | 11/2008 | Ito et al. | 349/43 |
| 2010/0155792 A1 | 6/2010 | Ryu et al. | |
| 2010/0224880 A1* | 9/2010 | Kimura | H01L 27/1225 257/59 |

FOREIGN PATENT DOCUMENTS

| | | |
|---|---|---|
| JP | H10-341022 A | 12/1998 |
| JP | H11-194362 A | 7/1999 |
| JP | 2006-133769 A | 5/2008 |
| JP | 2008-286911 A | 11/2008 |
| JP | 2010-147458 A | 7/2010 |
| JP | 2010-152298 A | 7/2010 |
| JP | 2011-049297 A | 3/2011 |
| TW | 200725911 A | 7/2007 |

OTHER PUBLICATIONS

Manabu Ito, Applied Physics, (vol. 7), (Issue. 7), (p. 809-812), (2008).

K. Nomura et al., "Room-temperature fabrication of transparent flexible thin-film transistors using amorphous oxide semiconductors," Nature, (vol. 432), (p. 488-492), (2004).

The Taiwan Patent Office, "Office Action," (Taiwan), (Mar. 13, 2015).

* cited by examiner

THIN FILM TRANSISTOR AND IMAGE DISPLAYING APPARATUS

TECHNICAL FIELD

The present invention relates to a thin film transistor that is available for use in a driving element and the like of an image displaying apparatus, and an image displaying apparatus.

BACKGROUND ART

Thus far, a thin film transistor for which amorphous silicon, polycrystalline silicon or the like has been used as a driving transistor for electronic devices. However, amorphous silicon or polycrystalline silicon does not have optical transparency and has light sensitivity in the visible light range, and therefore a light-blocking film is required. Therefore, in a case in which the thin film transistors are present on the front side of displaying elements when viewed from the display observation side, the visibility of display is affected. Therefore, the thin film transistors were disposed on the rear side of the displaying elements.

For the colorization of reflective display apparatuses such as reflective liquid crystal display apparatuses or electrophoretic display apparatuses, color filters are generally used. Here, for the above-described reason, display apparatuses for which color filters are used have a structure in which a liquid crystal-encapsulating layer or an electrophoretic particle layer is formed between the color filters and the thin film transistors. However, when the color filters and the thin film transistors are formed at the above-described location, for example, in a case in which the liquid crystal-encapsulating layer is used, it is necessary to align the thin film transistors and the color filters after encapsulating liquid crystals. Therefore, it is difficult to obtain high accuracy, and cost rise or yield reduction results.

Therefore, it is attempted to facilitate the aligning of the color filters and the thin film transistors by forming thin film transistors having optical transparency on the color filters. In this case, since the thin film transistors have optical transparency, it is possible to dispose the thin film transistors on the front side of displaying elements when viewed from the display observation side, and the produced display has a structure in which images are visible through the thin film transistors having optical transparency (see NPL 1).

Here, for semiconductor layers in the thin film transistors having optical transparency, for example, indium gallium zinc oxide or the like is frequently used (see NPL 2).

In addition, for gate electrodes or capacitor, electrodes in thin film transistors having optical transparency, for example, indium tin oxide (ITO) or the like is frequently used.

In addition, for gate insulating layers in thin film transistors, for example, silicon nitride films formed using chemical vapor deposition (CVD) or the like is frequently used. In a case in which a silicon nitride film or the like is formed using CVD, it is common to carry out a surface treatment using $H_2$ plasma as means for cleaning the substrate, and then to form the film using reactive gas such as $SiH_4$ or the like.

CITATION LIST

Patent Literature

PTL 1: Japanese Patent Application Laid-Open No. 10-341022

Non Patent Literatures

NPL 1: Manabu Ito, Applied Physics 77 [7] (2008)
NPL 2: K. Nomura et al., Nature 432, 488 (2004)

SUMMARY OF INVENTION

Technical Problem

However, in a case in which the surface treatment using $H_2$ plasma is carried out using CVD and a silicon nitride film or the like is formed using the reactive gas of $SiH_4$ or the like on a substrate on which a gate electrode has been formed using ITO, it is known that ITO is reduced due to H and the light transmittance is decreased (ITO blackens) (see PTL 1).

A decrease in the light transmittance of a gate electrode and a capacitor electrode which configure the thin film transistor having optical transparency results in a decrease in the brightness or contrast of a display screen of an image displaying apparatus having a structure in which the thin film transistors having optical transparency are formed on color filters in the end.

Therefore, to achieve the above-described requirement, an object of the invention is to realize a thin film transistor having high optical transparency and an image displaying apparatus for which the thin film transistors are used.

Solution to Problem

According to a first aspect of the invention, there is provided a thin film transistor in which at least a gate electrode, a capacitor electrode, a gate insulating layer, a semiconductor layer, a source electrode and a drain electrode are formed of a material having optical transparency on an insulating substrate having optical transparency, where the gate electrode and the capacitor electrode or the source electrode and the drain electrode are made up of first layers in contact with the insulating substrate and second layers in contact with the gate insulating layer, the first layers are made of indium tin oxide, and the second layers are made of an metallic oxide containing at least one of indium, gallium and zinc.

In addition, the second layers may be made of the same material as the semiconductor layer.

Furthermore, an average transmittance of the gate electrode and the capacitor electrode or the source electrode and the drain electrode in a visible light range may be 70% or more.

In addition, the semiconductor layer may be made of a metallic oxide containing at least one of indium, gallium and zinc.

Furthermore, the gate insulating layer may be a compound containing at least any one of silicon oxide, silicon nitride and silicon oxynitride formed using CVD.

In addition, the thin film transistor may be a bottom gate-type TFT.

Furthermore, the thin film transistor may be a top gate-type TFT.

According to a second aspect of the invention, there is provided an image displaying apparatus including an array of the thin film transistors, a pixel electrode in connection with the source electrode or the drain electrode of the thin film transistor, and an image displaying medium disposed on the pixel electrode.

In addition, color filters may be formed on an insulating substrate of the array of the thin film transistors.

Advantageous Effects of Invention

In the thin film transistor of the invention, since each of the gate electrode and the capacitor electrode is made into a double layer structure, the first layers in contact with the substrate are made of ITO, and the second layers in contact with the gate insulating layer are made of an metallic oxide layer that suppresses the blackening of ITO, it becomes possible to form the gate electrode and the capacitor electrode having high optical transparency and high conductivity. Therefore, with the thin film transistor of the invention, it becomes possible to realize a thin film transistor having high optical transparency and an image displaying apparatus having excellent display performance by using the above-described gate electrode and the above-described capacitor electrode.

It becomes possible to obtain a thin film transistor having optical transparency in which at least a gate electrode, a capacitor electrode, a gate insulating layer, semiconductor layer, a source electrode and a drain electrode are formed on an insulating substrate having optical transparency using a material having optical transparency, and the gate electrode has sufficient conductivity by forming the gate electrode using two layers of different metallic oxides and producing the first layers in contact with the insulating substrate using indium tin oxide (ITO).

However, in a case in which a silicon nitride film or the like which serves as the gate insulating layer is formed using CVD on the substrate on which the gate electrode has been formed using ITO, ITO is reduced due to H during a $H_2$ plasma treatment before forming a film and the film-forming process, and the transmittance is decreased (ITO is blackened). A decrease in the transmittance of the gate electrode and the capacitor electrode which configure the thin film transistor having optical transparency results in a decrease in the brightness or contrast of a display screen of an image displaying apparatus having a structure in which the thin film transistors having optical transparency are formed on color filters in the end.

Therefore, it is possible to suppress the blackening of ITO during the stacking of the gate insulating layer and to maintain the light transparency of the gate electrode by forming a metallic oxide containing at least one of indium, gallium and zinc for the second layers of the gate electrode in contact with the gate insulating layer and the capacitor electrode.

In addition, it is possible to reduce the process cost compared with a case in which different materials are used by forming the second layers of the gate electrode and the second layers of the capacitor electrode using the same material as the semiconductor layer.

Furthermore, it is possible to obtain a thin film transistor having high optical transparency by setting the average transmittance of the gate electrode and the capacitor electrode in the visible light range ($\lambda$=400 nm to 700 nm) to 70% or more.

In addition, it is possible to realize a thin film transistor having high light transmittance and high performance by forming the semiconductor layer using a metallic oxide containing at least one of indium, gallium and zinc.

Furthermore, it is possible to obtain a cheap gate insulating layer having sufficient voltage resistance by including at least one compound of silicon oxide, silicon nitride and silicon oxynitride in a form of a film formed using CVD as the gate insulating layer.

In the image displaying apparatus of the invention, it is possible to realize an array of thin film transistors having high light transmittance and favorable characteristics by producing the array of thin film transistors using the above-described method.

In addition, it is possible to realize an image displaying apparatus having high luminance and high contrast without a process for aligning a thin film transistor substrate and a color filter substrate by forming the above-described array of thin film transistors having optical transparency on an insulating substrate on which color filters have been formed.

DESCRIPTION OF EMBODIMENTS

Hereinafter, an embodiment of the invention will be described based on the drawings.

In the present embodiment, a thin film transistor according to the invention is applied to a bottom gate-type thin film transistor (TFT). Meanwhile, the thin film transistor according to the invention is not limited to the bottom gate-type TFT. For example, the thin film transistor according to the invention may be applied to a top gate-type TFT.

Figure 1:
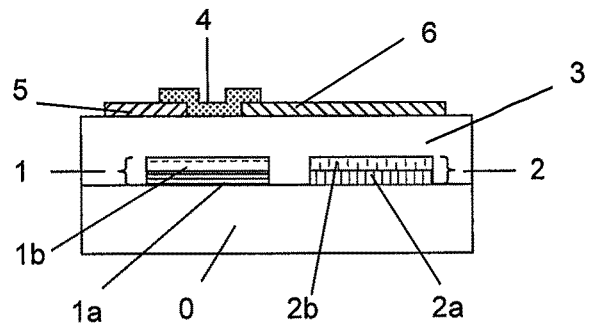
FIG. 1 is a schematic cross-sectional view illustrating a structure of a thin film transistor according to an embodiment of the invention.

FIG. 1 is a schematic cross-sectional view illustrating a structure of the thin film transistor of the embodiment.

As illustrated in FIG. 1, the thin film transistor includes an insulating substrate 0, a gate electrode 1, a capacitor electrode 2, a gate insulating layer 3, a semiconductor layer 4, a source electrode 5 and a drain electrode 6.

The insulating substrate 0 is formed of a material having optical transparency. In the embodiment, "having optical transparency" refers to an average transmittance in the visible light range ($\lambda$=400 nm to 700 nm) of 70% or more. Specific examples of the material for the insulating substrate 0 include polymethyl methacrylatae, polyacrylate, polycarbonate, polystyrene, polyethylene sulfide, polyethersulfone, polyolefin, polyethylene terephthalate, polyethylene naphthalate, cycloolefin polymers, polyether salphene, triacetyl cellulose, polyvinyl fluoride films, ethylene tetrafluoroethylene copolymer resins, weather-resistant polyethylene terephthalate, weather-resistant polypropylene, glass fiber-reinforced acryl resin films, glass fiber-reinforced polycarbonate, transparent polyimide, fluorine-based resins, cyclic polyolefin-based resins, glass, silica and the like. The above-described materials may be used in a form of a single base material, but it is also possible to use the above-described materials in a form of a composite base material obtained by stacking two or more materials.

Meanwhile, in a case in which an organic substance film is used as the material for the insulating substrate 0, it is preferable to form a gas barrier layer having optical transparency to improve the durability of the element (thin film transistor). It is possible to use $Al_2O_3$, $SiO_2$, $SiN$, $SiON$, $SiC$, diamond-like carbon or the like for the gas barrier layer. Meanwhile, the material for the gas barrier layer is not limited thereto. In addition, it is also possible to use the gas barrier layer in a form of a laminate of two or more layers. Furthermore, the gas barrier layer may be formed only on one surface of the organic substance film, and may be formed on both surfaces of the organic substance film. It is possible to form the gas barrier layer using a deposition method, an ion plating method, a sputtering method, CVD, a sol-gel method or the like. Meanwhile, the method for forming the gas barrier layer is not limited thereto.

The gate electrode 1 and the capacitor electrode 2 are formed on the insulating substrate 0. The gate electrode 1 and the capacitor electrode 2 are formed of a material having optical transparency. The gate electrode 1 and the capacitor electrode 2 are made up of first layers 1a and 2a which are in contact with the insulating substrate 0 and second layers 1b and 2b which are in contact with the gate insulating layer 3. The first layer 1a for the gate electrode 1 and the first layer 2a for the capacitor electrode 2, and the second layer 1b for the gate electrode 1 and the second layer 2b for the capacitor electrode 2 may be made of the same material, or may be made of different materials. However, the first layer 1a for the gate electrode 1 and the first layer 2a for the capacitor electrode 2 and the second layer 1b for the gate electrode 1 and the second layer 2b for the capacitor electrode 2 are more desirably made of the same material to decrease the number of processes in a process for manufacturing the thin film transistor.

As the material for the first layer 1a for the gate electrode 1 and the first layer 2a for the capacitor electrode 2, it is possible to use indium tin oxide (ITO). Then, it is possible to form films having high light transmittance and low resistivity (sufficient conductivity) as the first layer 1a for the gate electrode 1 and the first layer 2a for the capacitor electrode 2.

The second layer 1b for the gate electrode 1 and the second layer 2b for the capacitor electrode 2 are formed of a material having optical transparency. As the material for the second layer 1b for the gate electrode 1 and the second layer 2b for the capacitor electrode 2, it is possible to use an oxide or the like containing at least one of indium, gallium and zinc. More specifically, it is possible to use a well-known material such as zinc oxide, indium oxide, indium zinc oxide or indium gallium zinc oxide (IGZO). Meanwhile, the material for the second layer 1b for the gate electrode 1 and the second layer 2b for the capacitor electrode 2 is not limited thereto. It is possible to form the material using a sputtering method, a vacuum deposition method or the like. Meanwhile, the method for forming the material for the second layer 1b for the gate electrode 1 and the second layer 2b for the capacitor electrode 2 is not limited thereto.

Regarding the patterning order of the first layer 1a for the gate electrode 1 and the first layer 2a for the capacitor electrode 2, it is preferable to carry out the patterning of the second layer 1b for the gate electrode 1 and the second layer 2b for the capacitor electrode 2 at the same time to decrease the process cost. Specifically, layers which serve as the second layers 1b and 2b and are made of a well-known material such as zinc oxide, indium oxide, indium zinc oxide or indium gallium zinc oxide (IGZO) are formed on ITO layers which serve as the first layers 1a and 2a for the gate electrode 1 and the capacitor electrode 2. In addition, the formed layers are patterned using photolithography, thereby patterning the first layers 1a and 2a and the second layers 1b and 2b for the gate electrode 1 and the capacitor electrode 2 at the same time.

As described above, in the thin film transistor of the embodiment, each of the gate electrode 1 and the capacitor electrode 2 are made into double layer structures respectively, the first layers 1a and 2a in contact with the insulating substrate 0 are made of ITO, and the second layers 1b and 2b in contact with the gate insulating layer 3 are made of an metallic oxide layer that suppresses the blackening of ITO. Therefore, it becomes possible to form the gate electrode 1 and the capacitor electrode 2 having high optical transparency and high conductivity. Therefore, with the thin film transistor of the embodiment, it becomes possible to realize a thin film transistor having high optical transparency and an image displaying apparatus having excellent display performance by using the above-described gate electrode 1 and the above-described capacitor electrode 2.

In addition, in the thin film transistor of the embodiment, the gate electrode 1 and the capacitor electrode 2 are given optical transparency. That is, the average transmittance of the gate electrode 1 and the capacitor electrode 2 in the visible light range was set to 70% or more. Therefore, in the thin film transistor of the embodiment, it is possible to obtain a thin film transistor having high optical transparency. Meanwhile, the average transmittance of the gate electrode 1 and the capacitor electrode 2 in the visible light range is preferably higher.

The material for the second layer 1b for the gate electrode 1 and the second layer 2b for the capacitor electrode 2 is preferably the same material for semiconductor layer 4. Then, it is possible to decrease the process cost. In addition, it is possible to form the second layer 1b for the gate electrode 1 and the second layer 2b for the capacitor electrode 2 using a sputtering method, a vacuum deposition method or the like. Meanwhile, the method for forming the second layer 1b for the gate electrode 1 and the second layer 2b for the capacitor electrode 2 is not limited thereto.

The gate insulating layer 3 is formed on the insulating substrate 0 so as to cover the gate electrode 1 and the capacitor electrode 2. The gate insulating layer 3 is formed of a material having optical transparency. As the material for the gate insulating layer 3, it is possible to use a compound or the like containing any one of silicon oxide, silicon nitride and silicon oxynitride formed using CVD. Then, it is possible to form a cheap film having a sufficient insulating property as the gate insulating layer 3. Meanwhile, it is preferable to carry out a $H_2$ plasma treatment or the like as a process for cleaning the substrate before the formation of the gate insulating layer 3.

The semiconductor layer 4 is formed on the gate insulating layer 3. The semiconductor layer 4 is formed of a material having optical transparency. As the material for the semiconductor layer 4, it is possible to use an oxide containing at least one of indium, gallium and zinc. More specifically, it is possible to use a well-known material such as zinc oxide, indium oxide, indium zinc oxide or indium gallium zinc oxide (IGZO). Then, it is possible to realize a thin film transistor having high light transmittance and high performance. Meanwhile, the material for the semiconductor layer 4 is not limited thereto. It is possible to form the semiconductor layer 4 using a vacuum deposition method, a sputtering method or the like. Meanwhile, the method for forming the semiconductor layer 4 is not limited thereto.

The source electrode 5 and the drain electrode 6 are formed on the gate insulating layer 3 so as to sandwich the semiconductor layer 4. The source electrode 5 and the drain electrode 6 are formed of a material having optical transparency. The material for the source electrode 5 and the drain electrode 6 is preferably an oxide material such as indium oxide, tin oxide, indium tin oxide, zinc oxide, cadmium oxide, indium cadmium oxide, cadmium tin oxide, zinc tin oxide or indium zinc oxide. The source electrode 5 and the drain electrode 6 may be made of the same material, or may be made of different materials. However, the source electrode 5 and the drain electrode 6 are more desirably made of the same material to decrease the number of processes in a process for manufacturing the thin film transistor. It is possible to form the source electrode 5 and the drain electrode 6 using a vacuum deposition method, a sputtering method or the like. Meanwhile, the method for forming the source electrode 5 and the drain electrode 6 is not limited thereto.

Meanwhile, in the embodiment, a configuration in which only the gate electrode 1 and the capacitor electrode 2 are made into a double layer structure has been described, but the configuration is not limited thereto. For example, a wiring layer, that is, a layer or the like which is formed below the gate insulating layer 3 using ITO as a material and needs to be transparent may also be made into a double layer structure similarly to the gate electrode 1 and the capacitor electrode 2. Examples of the above-described wiring layer in a double layer structure include a gate wiring layer, a capacitor wiring layer and the like. It is possible to form the wiring layer in a double layer structure using the same process as for the gate electrode 1 and the capacitor electrode 2.

In addition, in the embodiment, a configuration in which the thin film transistor according to the invention is applied to a bottom gate-type TFT has been described as an example, but other configurations are also employable. For example, the thin film transistor according to the invention may be applied to a top gate-type TFT. In a case in which the thin film transistor according to the invention is made into a top gate-type TFT, the semiconductor layer 4, the source electrode 5 and the drain electrode 6 are formed on the insulating substrate 0, and the gate insulating layer 3 is formed on the formed semiconductor layer 4, the formed source electrode 5 and the formed drain electrode 6. In this case, the source electrode 5 and the drain electrode 6 are desirably made into a double layer structure similarly to the gate electrode 1 and the capacitor electrode 2 of the embodiment. The source electrode 5 and the drain electrode 6 are made of a material having optical transparency. For example, as the material for first layers for the source electrode 5 and the drain electrode 6, that is, the first layers in contact with the insulating substrate 0, it is possible to use indium tin oxide. In addition, as the material for second layers for the source electrode 5 and the drain electrode 6, that is, the second layers in contact with the gate insulating layer 3, it is possible to use a metallic oxide or the like containing at least one of indium, gallium and zinc.

Furthermore, in a case in which the thin film transistor according to the invention is made into atop gate-type TFT, when the gate electrode 1 and the capacitor electrode 2 are formed on the gate insulating layer 3, and silicon nitride is stacked on the formed gate electrode 1 and the formed capacitor electrode 2 as interlayer insulating layers, the gate electrode 1 and the capacitor electrode 2 are also made into a double layer structure.

Hereinafter, specific examples of the thin film transistor of the embodiment will be described.

Example 1

Next, Example 1 of the thin film transistor of the embodiment will be described based on the drawings.

FIG. 1 is a schematic view of a thin film transistor produced in Example 1.

In Example 1, the thin film transistor illustrated in FIG. 1 was produced. Specifically, alkali-free glass 1737 manufactured by Corning Incorporated was used for the insulating substrate 0, and ITO films (thickness of 100 nm) which formed the first layers 1a and 2a for the gate electrode 1 and the capacitor electrode 2 and IGZO films (thickness of 10 nm) which formed the second layers 1b and 2b were formed on the insulating substrate 0 at room temperature using a DC magnetron sputtering apparatus. Next, the ITO films and the IGZO films, which had been formed at room temperature, were etched at the same time using photolithography, thereby forming the gate electrode 1 and the capacitor electrode 2. When forming the ITO films, the amount of power supplied was set to 200 W, the gas flow rate was set to 100 SCCM for Ar and 1 SCCM for $O_2$, and the film-forming pressure was set to 1.0 Pa. When forming the IGZO films, the amount of power supplied was set to 200 W, the gas flow rate was set to 100 SCCM for Ar and 2 SCCM for $O_2$, and the film-forming pressure was set to 1.0 Pa. Next, a $H_2$ plasma treatment was carried out on the insulating substrate 0 on which the gate electrode 1 and the capacitor electrode 2 had been formed using a plasma CVD apparatus, and then a SiNx film (thickness of 300 nm) was formed, thereby forming the gate insulating layer 3. When forming the SiNx film, 50 SCCM of $SiH_4$ and 50 SCCM of $NH_3$ were made to flow as raw material gases, and the amount of power supplied was set to 300 W, the film-forming pressure was set to 3.0 Pa, and the substrate temperature was set to 200° C. Next, an IGZO film (thickness of 40 nm) was formed at room temperature on the insulating substrate 0 on which the gate insulating layer 3 had been formed using a DC magnetron sputtering apparatus, and the IGZO film formed at room temperature was etched using photolithography, thereby forming the semiconductor layer 4 using an oxide. When forming the IGZO film, the amount of power supplied was set to 100 W, the gas flow rate was set to 100 SCCM for Ar and 2 SCCM for $O_2$, and the film-forming pressure was set to 1.0 Pa. Finally, an ITO film (thickness of 50 nm) was formed at room temperature on the insulating substrate 0 on which the semiconductor layer 4 had been formed using a DC magnetron sputtering apparatus, and the ITO film formed at room temperature was etched using photolithography, thereby forming the source electrode 5 and the drain electrode 6. Therefore, a thin film transistor was produced. When forming the ITO film, the amount of power supplied was set to 200 W, the gas flow rate was set to 100 SCCM for Ar and 1 SCCM for $O_2$, and the film-forming pressure was set to 1.0 Pa. The length (gate length) between the source electrode 5 and the drain electrode 6 was set to 20 μm. In addition, the width (gate width) between the source electrode 5 and the drain electrode 6 was set to 5 μm.

In the produced thin film transistor, the average transmittance of the gate electrode 1 in the visible light range ($\lambda$=400 nm to 700 nm) was 80%. Therefore, it could be confirmed that the thin film transistor of the present example satisfied the required value (70% or more) for the average transmittance of the gate electrode 1. In addition, the transistor characteristics of the thin film transistor were measured using a semiconductor parameter analyzer (SCS4200 manufactured by Keithlay Instruments Inc.) with a gate voltage set in a range of −10 V to +20 V and a drain voltage set to 5V. As a result, favorable transistor characteristics were exhibited as follows: the mobility was 10 cm$^2$/Vs, the ON/OFF ratio when a voltage of 10 V was applied between the source electrode 5 and the drain electrode 6 was 8 digits, and the gate leak current at a gate voltage of 20 V was $4.2\times10^{-11}$ A.

Example 2

Next, Example 2 of the thin film transistor of the embodiment will be described based on the drawings.

Figure 2:
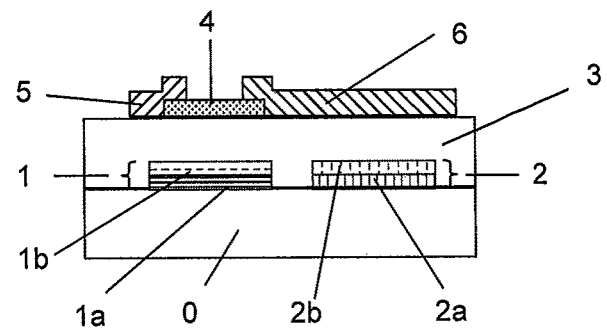
FIG. 2 is a schematic cross-sectional view illustrating a structure of a thin film transistor according to Example 2 of the invention.
Figure 3:
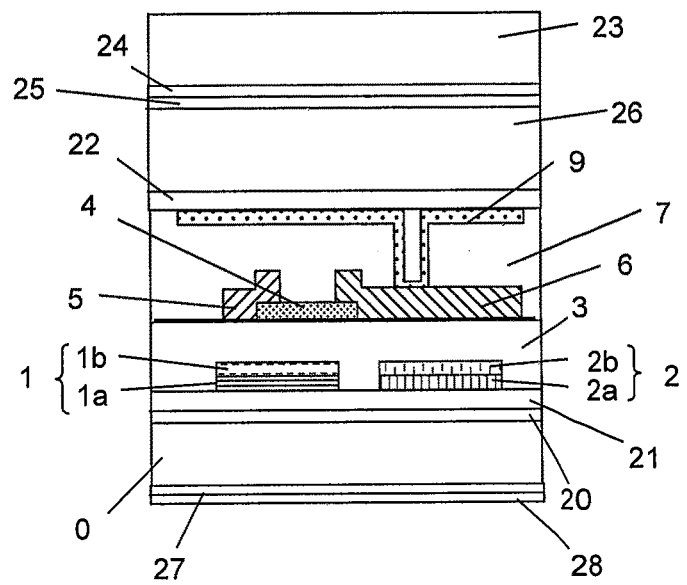
FIG. 3 is a schematic cross-sectional view illustrating a pixel in an image displaying apparatus for which the thin film transistor according to Example 2 is used.

FIG. 2 is a schematic cross-sectional view illustrating a structure of a thin film transistor of Example 2. FIG. 3 is a schematic cross-sectional view illustrating a structure of an image displaying apparatus of Example 2.

In Example 2, the thin film transistor as illustrated in FIG. 2 and the image displaying apparatus as illustrated in FIG. 3 were produced. Specifically, alkali-free glass 1737 manufactured by Corning Incorporated was used for the insulating substrate 0, a R (red) photosensitive resin was applied to the insulating substrate 0 using a spin coating method, and then a pattern was formed using photolithography. Similarly, G (green) and B (blue) photosensitive resins were applied using a spin coating method, and then a pattern was formed using photolithography, thereby forming a color filter layer (color filters) 20. Next, a resin having optical transparency was applied on the color filter layer 20 using a spin coating method, thereby forming an overcoat layer 21. Therefore, a color filter substrate was produced.

Next, ITO films (thickness of 100 nm) which formed the first layers 1a and 2a for the gate electrode 1 and the capacitor electrode 2 and IGZO films (thickness of 10 nm) which formed the second layers 1b and 2b were formed on the produced color filter substrate at room temperature using a DC magnetron sputtering apparatus. Next, the ITO films and the IGZO films, which had been formed at room temperature, were etched at the same time using photolithography, thereby forming the gate electrode 1 and the capacitor electrode 2. When forming the ITO films, the amount of power supplied was set to 200 W, the gas flow rate was set to 100 SCCM for Ar and 1 SCCM for O$_2$, and the film-forming pressure was set to 1.0 Pa. When forming the IGZO films, the amount of power supplied was set to 200 W, the gas flow rate was set to 100 SCCM for Ar and 2 SCCM for O$_2$, and the film-forming pressure was set to 1.0 Pa. Next, a H$_2$ plasma treatment was carried out on the color filter substrate on which the gate electrode 1 and the capacitor electrode 2 had been formed using a plasma CVD apparatus, and then a SiNx film (thickness of 300 nm) was formed, thereby forming the gate insulating layer 3. When forming the SiNx film, 50 SCCM of SiH$_4$ and 50 SCCM of NH$_3$ were made to flow as raw material gases, and the amount of power supplied was set to 300 W, the film-forming pressure was set to 3.0 Pa, and the substrate temperature was set to 200° C. Next, an IGZO film (thickness of 40 nm) was formed at room temperature on the color filter substrate on which the gate insulating layer 3 had been formed using a DC magnetron sputtering apparatus, and the IGZO film formed at room temperature was etched using photolithography, thereby forming the semiconductor layer 4 using an oxide. When forming the IGZO film, the amount of power supplied was set to 100 W, the gas flow rate was set to 100 SCCM for Ar and 2 SCCM for O$_2$, and the film-forming pressure was set to 1.0 Pa. Next, an ITO film (thickness of 50 nm) was formed at room temperature on the color filter substrate on which the semiconductor layer 4 had been formed using a DC magnetron sputtering apparatus, and the ITO film formed at room temperature was etched using photolithography, thereby forming the source electrode 5 and the drain electrode 6. Then, an array of the thin film transistors was produced on the color filter substrate. When forming the ITO film, the amount of power supplied was set to 200 W, the gas flow rate was set to 100 SCCM for Ar and 1 SCCM for O$_2$, and the film-forming pressure was set to 1.0 Pa. The length (gate length) between the source electrode 5 and the drain electrode 6 was set to 20 µm. In addition, the width (gate width) between the source electrode 5 and the drain electrode 6 was set to 5 µm.

Furthermore, a SiON film (thickness of 50 nm) was formed on the produced array of the thin film transistors using an RF magnetron sputtering apparatus. Next, the formed SiON film was etched using photolithography, thereby forming a protective layer 7. When forming the SiON film, the amount of power supplied was set to 500 W, the gas flow rate was set to 100 SCCM for Ar and 10 SCCM for O$_2$, and the film-forming pressure was set to 0.5 Pa. Next, a photosensitive resin was applied to the produced array of the thin film transistors (on the protective layer 7) using a spin coating method, and a through hole was opened on the applied photosensitive resin (thickness of 3 µm) at a portion above the drain electrode 6 using photolithography, thereby forming an interlayer insulating layer (not illustrated). Next, an ITO film (thickness of 50 nm) was formed at room temperature on the produced array of the thin film transistors using a DC magnetron sputtering apparatus. Next, the ITO film formed at room temperature was etched using photolithography, thereby forming a pixel electrode 9 connected to the source electrode 5 or the drain electrode 6. Meanwhile, the produced array of the thin film transistors was an array in which thin film transistors having a pixel number of 480×640 were arrayed. The channel length of the array of the thin film transistors was set to 20 µm. In addition, the channel width of the array of the thin film transistors was set to 5 µm. Next, an orientation film 22 was formed on the array of the thin film transistors (on the pixel electrode 9) produced in the above-described manner.

Meanwhile, alkali-free glass 1737 (thickness of 0.7 mm) manufactured by Corning Incorporated was used for an image displaying substrate 23, and an ITO thin film (thickness of 70 nm) which formed a common electrode 24 was formed on the image displaying substrate 23. Next, an orientation film 25 was formed on the formed ITO thin film. Then, a base material on which the thin film transistors had been formed was produced. Next, the produced base material was disposed opposite (on the pixel electrode 9) to the array of the thin film transistors through spacers. Next, a liquid crystal 26 was encapsulated between the spacers, that is, between the base material and the array of the thin film transistors (on the pixel electrode 9) as an image displaying medium. Finally, a phase difference sheet 27 and a polarization sheet 28 were disposed on one of two surfaces of the array of the thin film transistors on which the color filter layer 20 was not formed. Then, in Example 2, an image displaying apparatus was produced using the array of the thin film transistors.

As a result of driving the produced image displaying apparatus, the image displaying apparatus could favorably display colors.

As described above, for the image displaying apparatus of the embodiment, an array of the thin film transistors was produced using the thin film transistor of the embodiment. Therefore, it is possible to realize an array of thin film transistors having high optical transparency and high performance in the image displaying apparatus of the embodiment.

In addition, in the image displaying apparatus of the embodiment, the array of the thin film transistors was formed on the insulating substrate 0 on which the color filter layer 20 had been formed. Therefore, the image displaying apparatus of the embodiment is capable of making the process for aligning the thin film transistors and the color filter layer 20 unnecessary. In addition, it is possible to realize an image displaying apparatus having high luminance and high contrast.

Comparative Example 1

Next, Comparative Example 1 of the thin film transistor of the embodiment will be described based on the drawing.

Figure 4:
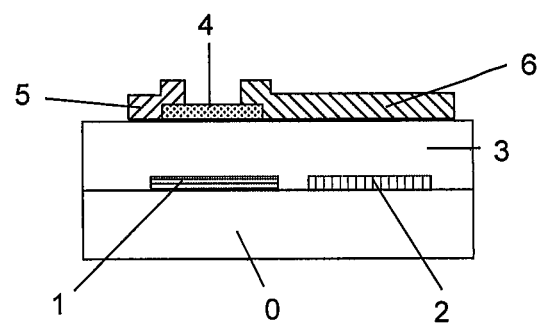
FIG. 4 is a schematic cross-sectional view illustrating a structure of a thin film transistor according to Comparative Example 1.

FIG. 4 is a schematic view of a thin film transistor produced in Comparative Example 1.

In Comparative Example 1, the thin film transistor illustrated in FIG. 4 was produced. Specifically, alkali-free glass 1737 manufactured by Corning Incorporated was used for the insulating substrate 0, and ITO films (thickness of 100 nm) which formed the first layers 1a was formed on the insulating substrate 0 at room temperature using a DC magnetron sputtering apparatus. Next, the ITO films, which had been formed at room temperature, were etched at the same time using photolithography, thereby forming the gate electrode 1 and the capacitor electrode 2. When forming the ITO films, the amount of power supplied was set to 200 W, the gas flow rate was set to 100 SCCM for Ar and 1 SCCM for $O_2$, and the film-forming pressure was set to 1.0 Pa. Next, a $H_2$ plasma treatment was carried out on the insulating substrate 0 on which the gate electrode 1 and the capacitor electrode 2 had been formed using a plasma DVD apparatus, and then a SiNx film (thickness of 300 nm) was formed, thereby forming the gate insulating layer 3. When forming the SiNx film, 50 SCCM of $SiH_4$ and 50 SCCM of $NH_3$ were made to flow as raw material gases, and the amount of power supplied was set to 300 W, the film-forming pressure was set to 3.0 Pa, and the substrate temperature was set to 150° C. Next, an IGZO film (thickness of 40 nm) was formed at room temperature using a DC magnetron sputtering apparatus, and the IGZO film formed at room temperature was etched using photolithography, thereby forming the semiconductor layer 4 using an oxide. When forming the IGZO film, the amount of power supplied was set to 100 W, the gas flow rate was set to 100 SCCM for Ar and 2 SCCM for $O_2$, and the film-forming pressure was set to 1.0 Pa. Finally, an ITO film (thickness of 50 nm) was formed at room temperature using a DC magnetron sputtering apparatus, and the ITO film formed at room temperature was etched using photolithography, thereby forming the source electrode 5 and the drain electrode 6. Therefore, a thin film transistor was produced. When forming the ITO film, the amount of power supplied was set to 200 W, the gas flow rate was set to 100 SCCM for Ar and 1 SCCM for $O_2$, and the film-forming pressure was set to 1.0 Pa. The length (gate length) between the source electrode 5 and the drain electrode 6 was set to 20 μm. In addition, the width (gate width) between the source electrode 5 and the drain electrode 6 was set to 5 μm.

In the produced thin film transistor, the average transmittance of the gate electrode 1 in the visible light range (λ=400 nm to 700 nm) was 69%. Therefore, it was confirmed that the thin film transistor of the present comparative example failed to satisfy the minimum required value (70% or more) for the average transmittance of the gate electrode 1. Meanwhile, the transistor characteristics of the thin film transistor were measured using a semiconductor parameter analyzer (SCS4200 manufactured by Keithlay Instruments Inc.) with a gate voltage set in a range of −10 V to +20 V and a drain voltage set to 5 V. As a result, favorable transistor characteristics were exhibited as follows: the mobility was 9 $cm^2/Vs$, the ON/OFF ratio when a voltage of 10 V was applied between the source electrode 5 and the drain electrode 6 was 8 digits, and the gate leak current at a gate voltage of 20 V was $3.5×10^{-11}$ A.

INDUSTRIAL APPLICABILITY

In the thin film transistor of the invention, since each of the gate electrode and the capacitor electrode is made into a double layer structure, the first layers in contact with the substrate are made of ITO, and the second layers in contact with the gate insulating layer are made of an metallic oxide layer that suppresses the blackening of ITO, it becomes possible to form the gate electrode and the capacitor electrode having high optical transparency and high conductivity. Therefore, with the thin film transistor of the invention, it becomes possible to realize a thin film transistor having high optical transparency and an image displaying apparatus having excellent display performance by using the above-described gate electrode and the above-described capacitor electrode.

REFERENCE SIGNS LIST 0 insulating substrate
1 gate electrode
1a first layer for gate electrode
1b second layer for gate electrode
2 capacitor electrode
2a first layer for capacitor electrode
2b second layer for capacitor electrode
3 gate insulating layer
4 semiconductor layer
5 source electrode
6 drain electrode
7 protective layer
9 pixel electrode
20 color filter layer
21 overcoat layer
22 orientation film
23 image displaying substrate
24 common electrode
25 orientation film
26 liquid crystal
27 phase difference sheet
28 polarization sheet

The invention claimed is:

1. A thin film transistor in which at least a gate electrode, a capacitor electrode, a gate insulating layer, a semiconductor layer, a source electrode and a drain electrode are formed of a material having optical transparency on an insulating substrate having optical transparency,
   wherein the gate electrode and the capacitor electrode or the source electrode and the drain electrode are made up of first layers in contact with the insulating substrate and second layers in contact with the gate insulating layer, the second layers being formed on the first layers,
   the first layers are made of indium tin oxide, and
   the second layers are made of an metallic oxide containing indium, gallium and zinc.

2. The thin film transistor according to claim 1, wherein the second layers are made of the same material as the semiconductor layer.

3. The thin film transistor according to claim 1, wherein an average transmittance of the gate electrode and the capacitor electrode or the source electrode and the drain electrode in a visible light range is 70% or more.

4. The thin film transistor according to claim 1, wherein the semiconductor layer is made of a metallic oxide containing at least one of indium, gallium and zinc.

5. The thin film transistor according to claim 1, wherein the gate insulating layer is a compound containing at least any one of silicon oxide, silicon nitride and silicon oxynitride formed using CVD.

6. The thin film transistor according to claim 1, wherein the thin film transistor is a bottom gate-type TFT.

7. The thin film transistor according to claim 1, wherein the thin film transistor is a top gate-type TFT.

8. An image displaying apparatus comprising:
an array of the thin film transistors according to claim 1;
a pixel electrode in connection with the source electrode or the drain electrode of the thin film transistor; and
an image displaying medium disposed on the pixel electrode.

9. The image displaying apparatus according to claim 8, wherein color filters are formed on an insulating substrate of the array of the thin film transistors.

* * * * *